United States Patent [19]

Wyatt et al.

[11] Patent Number: 5,018,831
[45] Date of Patent: May 28, 1991

[54] OPTICAL RESONANT DEVICE

[75] Inventors: Richard Wyatt, Felixstowe; Keith H. Cameron, Woodbridge, both of England

[73] Assignee: British Telecommunications public limited company, London, England

[21] Appl. No.: 216,717

[22] PCT Filed: Nov. 6, 1987

[86] PCT No.: PCT/GB87/00788

§ 371 Date: Jul. 6, 1988

§ 102(e) Date: Jul. 6, 1988

[87] PCT Pub. No.: WO88/03723

PCT Pub. Date: May 19, 1988

[51] Int. Cl.$^5$ .......................... G02B 5/18; H01S 3/08
[52] U.S. Cl. ................. 350/162.17; 372/100; 372/101; 372/102
[58] Field of Search ............ 372/20, 32, 92, 98, 372/100, 101, 102; 332/751; 350/162.17, 162.19, 162.22, 162.23, 96.18, 96.19; 370/3

[56] References Cited

U.S. PATENT DOCUMENTS

| | | | |
|---|---|---|---|
| 3,774,121 | 11/1973 | Ashkin et al. | 372/20 |
| 3,968,456 | 7/1976 | Welch | 372/92 |
| 4,287,486 | 9/1981 | Javan | 372/102 |
| 4,464,759 | 8/1984 | Haus et al. | 372/20 |
| 4,504,950 | 3/1985 | AuYeung | 372/18 |
| 4,571,024 | 2/1986 | Husbands | 350/96.19 |
| 4,667,922 | 5/1987 | Cutburth et al. | 248/664 |
| 4,763,969 | 8/1988 | Khoe et al. | 350/96.18 |

OTHER PUBLICATIONS

Ludeke et al., "Fabrication for a Tunable Monochromatic Injection Laser"; IBM Technical Disclosure Bulletin, vol. 15, No. 2, Jul. 1972, pp. 546-547.
Ludeke et al., "Single Mode GaAs Laser in External Cavity", IBM Technical Disclosure Bulletin, vol. 15, No. 2, Jul. 1972, pp. 548-549.
Ludeke; "Multimode Tunable Cw GaAs Injection Laser", IBM Technical Disclosure Bulletin; vol. 15, No. 2, Jul. 1972, p. 550.
Ross et al.; "High Power Narrow Linewidth Operation of GaAs Diode Lasers", Appl. Phys. Lett, vol. 23, No. 1, Jul. 1973, pp. 25-27.
Metcalf et al.; "High-Capacity Wavelength Demultiplexer With a Large-Diameter Grinrod Lens", Applied Optics, vol. 21, No. 5; Mar. 1982, pp. 794-796.
Wyatt et al., "10 kHz Linewidth 1-5 um InGaAsP External Cavity Laser With 55 um Tuning Range", Electronics Letters, vol. 19, No. 3, Feb. 3, 1983, pp. 110-112.
Lee et al., "Measured Dynamic Linewidth Properties of a 1.5-um DFB=GRIN Rod Coupled-Cavity Laser Under Direct High-Frequency Modulation", Conf. on Optical Fiber Comm., 1986, M14, pp. 16-18.
Wyatt, "Spectral Linewidth of External Cavity Semiconductor Lasers With Strong, Frequency-Selective Feedback", Electronics Letters, vol. 21, No. 15, Jul. 18, 1985, pp. 658-659.
Opto-Electronics, vol. 6, No. 6, 1974, Chapman and Hall Ltd, J. C. Vanderleeden: "A Proposal for Wavelength-Tuning and Stabilization of GaAs Lasers with a Graded-Index Fibre Segment in a Dispersive Cavity", pp. 443-449.
Sov. J. Quantum Electron., vol. 15, No. 3, Mar. 1985, American Institute of Physics, (U.S.), A. P. Bogatov et al.: Nonlinear Refraction in Semiconductor Lasers (review), pp. 308-325.
Electronics Letters, vol. 21, No. 3, Jan. 31, 1985, M. R. Matthews et al.: "Packaged Frequency-Stable Tunable 20 kHz Line-Width 1.5 um InGaAsP External Cavity Laser", pp. 113-115.
Electronics Letters, vol. 19, No. 3, Feb. 3, 1983, R. Wyatt et al.: "10 kHz Linewidth 1.5 um InGaAsP External Cavity Laser with 55 nm Tuning Range", pp. 110-112.

Primary Examiner—Bruce Y. Arnold
Assistant Examiner—R. D. Shafer
Attorney, Agent, or Firm—Nixon & Vanderhye

[57] ABSTRACT

An optical resonant device comprises a laser diode (14), a graded-index collimating lens (11) and a prism grating (17). The lens (11) is rigidly connected to the prism grating (17). Coarse tuning by adjustment of the angle of incidence of light on the grating (17) is achieved by laterally offsetting the laser (14) relative to the central optical axis C of the lens (11). The grating (17) is angled relative to the optical axis C so that the tuned position of the laser (14) is at or close to the optical axis C.

16 Claims, 1 Drawing Sheet

OPTICAL RESONANT DEVICE

This invention relates to tunable optical resonant devices and in particular but not exclusively to long external cavity lasers.

In this specification, the term optical is intended to include those parts of the electromagnetic spectrum which is generally known as the visible region together with that part of the infra-red and ultra-violet regions at each end of the visible region.

For coherent optical communication systems it is desirable to have narrow line width laser sources while gas lasers are examples of such narrow line width laser sources, it is generally necessary to filter the output of semiconductor lasers which typically have broad linewidths of a few magahertz. Such filtration is wasteful and it is preferable to stimulate the laser with feedback of a particular wavelength in order to narrow the output linewidth. One of the ways of introducing selected feedback is by a distributed feedback laser, but at present the linewidths achievable are not satisfactory. Narrower linewidths of the order of 100 KHz have been achieved with long external cavity lasers where the light output from one facet of a semiconductor laser is collimated and reflected from a grating back through the collimating lens onto the laser facet. This feedback stimulation optimises further emmision of the same wavelength. An example of a tunable long external cavity laser is described in Electronics Letters 1983, 19, pp 110-112.

Typically the long external cavity laser consists of a semiconductor laser source, a collimating lens and a grating. Coarse tuning of the reflected wavelength is achieved by rotating the grating to alter the effective grating spacing and fine tuning is provided by adjustment of the path length between the laser and the grating. The path length may be altered by moving the grating closer to or further from the laser or by rotation of a tuning plate in the optical path. Rotation of such a tuning plate, which consists of a transparent plate of different optical density to air, causes the light to pass through at a greater or lesser angle and therefore to be in the plate for a different path length. An arrangement of this type is shown in FIG. 1.

The disadvantage of known long external cavity lasers is that there are three or four separate components each requiring alignment on the optical axis and a need to maintain that alignment during separate adjustments to the grating or grating and tuning plate. In the case of the three element system (no tuning plate) it is necessary to provide a mechanism capable of both rotating and translating the grating or in the case of the four element arrangement two rotating mechanisms are required.

One method of avoiding the need for a rotatable grating is described in a paper entitled "A proposal for wavelength-tuning and stabilization of GaAs lasers with a graded index fibre segment in a dispersive cavity" by J. C. Vanderleeden Opto-electronics, vol 6, no. 6, 1974 PP443-449. A quarter pitch graded-index (GRIN) lens has deposited on one end a grating perpendicular to its central optical axis. A laser diode is positioned in contact with the other end of the lens and laterally offset from the optical axis so that light from the laser diode impinges on the diffraction grating at an angle thereby providing the required selective feedback.

One disadvantage of this arrangement is that the laser diode must be offset a substantial distance from the optical axis of the lens. The acceptance solid angle of the lens decreases with increasing distance from the optical axis which for a lens with marginal f-number can increase the laser light losses, but also because a smaller area of the diffraction grating is then illuminated which adversely affects the resolution. Lens aberrations also increase as the offset increases.

The present invention is directed towards minimising the number of components that require alignment and to simplifying the tuning adjustment mechanisms in optical resonant cavity devices while permitting the optical source to be positioned at or close to the optical axis.

Accordingly the present invention provides a tunable optical resonant device having an external resonant cavity including an optical source, a collimator having a central optical axis, a grating positioned such that collimated light from the optical source is incident on the grating at a predetermined grating angle when the optical source is on the optical axis, and a support means for laterally offsetting the optical source relative to the optical axis.

The invention will now be described, by way of example only, with reference to the accompanying drawings in which.

Figure 1:
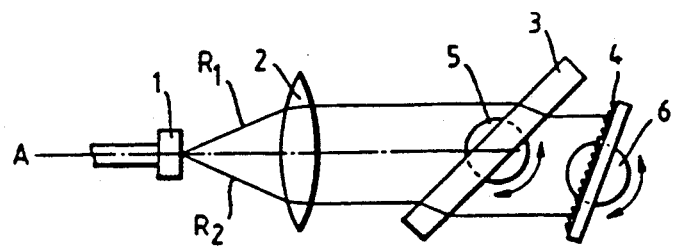
FIG. 1 is a schematic representation of a prior art device having a rotatable grating and a rotatable tuning plate.

FIG. 1 shows a four element prior art arrangement of an external cavity laser comprising a laser, centered on the central optical axis A of a collimating lens 2, a tuning plate 3 for path length adjustment and a grating 4. The grating 4 and tuning plate 3 are each necessarily mounted independently on rotatable supports 5 and 6 respectively because of the requirement for independent rotation of these elements to effect fine and coarse tuning. Exemplary rays $R_1$ and $R_2$ illustrate marginal rays through the optical system.

Figure 2:
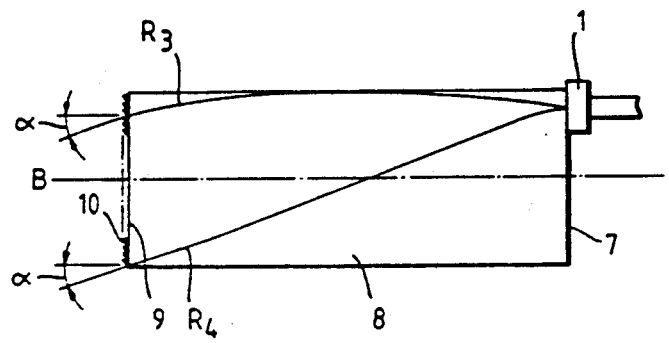
FIG. 2 is a schematic representation of a prior art device using a GRIN lens and an offset laser diode.

Referring to FIG. 2 there is shown another type of known external cavity laser comprising a laser diode 1 in contact with an end 7 of a GRIN lens 8 having a central optical axis B on whose other opposite end 9 is deposited a grating 10. The laser diode 1 is laterally offset a predetermined distance from the central optical axis B so that light from the laser diode 1 is collimated to impinge on the grating 9 at an angle a corresponding to the required tuned frequency as illustrated by marginal rays $R_3$ and $R_4$. The laser cavity can be tuned around this frequency to some degree by lateral displacement of the laser diode 1 about this design offset.

Figure 3:
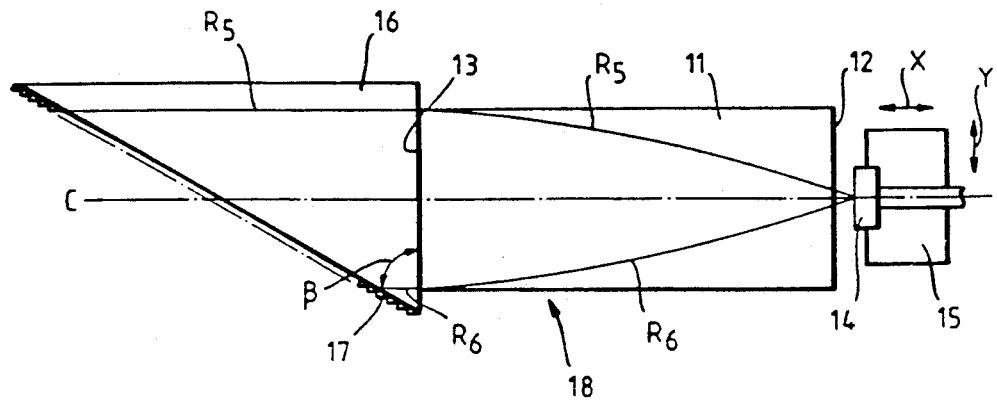
FIG. 3 is a schematic representation of a tunable laser resonant device according to the present invention.

Referring now to FIG. 3, there is shown an external cavity laser according to the present invention. A GRIN lens 11 constituting the collimator has ends 12 and 13 perpendicular to a central optical axis C. The lens 11 is short of a full quarter pitch.

A laser diode 14 is mounted near (ideally on) the central axis C a short distance from the end 12 on a support 15 which can move independently parallel and laterally relative to the axis C, as indicated by the arrows X and Y respectively.

A prism 16, glued to the end 13 of the lens 11 to form an assembly 18, has an internal angle $\beta$ to present a grating 17 formed on a prism surface at an angle $\beta$ to collimate light from the lens 11. The angle $\beta$ is chosen such that when the laser diode 14 is on the central axis C the collimated light emerging from the lens 11 will be parallel to the axis C, and will provide feeback at a design frequency determined by the grating angle $\beta$, as shown by the exemplary marginal rays $R_5$ and $R_6$. The laser diode 14 can be coarse tuned by movement laterally about the central axis C which varies the angle at which the light impinges on the grating 17 without the need to rotate the grating 17 relative to the axis C. In contrast to the prior art arrangement of FIG. 2, the laser diode 14 is located at or close to the central axis C thereby largely overcoming the disadvantages of such apparatus described above caused by necessarily having to locate the laser diode a significant distance away from the lens axis.

Because the need to rotate a grating has been eliminated, the grating and collimating lens of an external cavity laser can be integrated into a single rigid assembly as shown in FIG. 3 leaving only two elements to be initially maintained in alignment namely, the laser diode 14 and the lens grating assembly 18, which in the embodiment of FIG. 3 comprises the GRIN lens 11 and the prism 16 although other rigid assemblies may be used to connect these elements.

The length of the lens 11 is arranged to be less than a ¼ pitch to allow fine tuning of the laser cavity by relative longitudinal movement of the assembly 18 and laser 14 towards and away from the GRIN lens 11 to alter the cavity length. The lens may be short of any odd multiple of a quarter pitch to permit fine tuning by movement parallel to the axis C. It is particularly preferred for the longitudinal and transverse translations to be provided by piezoelectric devices mounted on a single support, although they may be completely independent or be fixed to different elements relative to a common support. Mechanical, other electrical or thermal means for providing the relative movements of the components can be readily envisaged.

In some instances it may be desirable to mount the lens and grating in a jig or frame to provide interconnection, particularly if a spherical lens is used, or for the lens to be attached to the laser.

A particularly compact arrangement is for the lens and grating to be manufactured integrally for example as a combined lens and prism grating.

A long external cavity laser as described above has been found to be able to tune the output of a semiconductor laser to a linewidth of the order of 100KHz.

We claim:

1. A tunable optical resonant device including:
   an external resonant cavity including an optical source,
   a collimator having a central optical axis,
   a grating fixed in a position with respect to said central optical axis such that it forms a substantially non-perpendicular, fixed angle with the central optical axis and such that collimated light from the optical source is incident on the grating at an angle which results in resonance at a predetermined wavelength when the optical source is substantially on the central optical axis, and
   support means for supporting the optical source substantially on the central optical axis and for tuning said device by laterally offsetting the optical source about the central optical axis.

2. A device as claimed in claim 1 in wherein the support means further provides movement of the optical source longitudinally relative to the grating.

3. A device as claimed in claim 1 wherein the collimator includes a GRIN lens.

4. A device as claimed in claim 3 wherein the lens is shorter than n-quarter pitch where n is odd.

5. A device as claimed in claim 1 wherein the grating is rigidly connected to the collimator.

6. A device as claimed in claim 5 wherein grating and collimator are integrally formed.

7. A device as claimed in claim 1 further including a prism optically coupled to said collimator, wherein the grating is disposed on a surface of said prism.

8. A device according to claim 1 wherein the relative movement of the optical source and collimator is provided by piezoelectric means.

9. A device according to claim 1 wherein the optical source comprises a semiconductor laser.

10. A tunable external cavity optical laser comprising:
    optical source means for radiating light;
    collimating lens means optically coupled to said source means for collimating the light radiated by said source means, said collimating lens means having a central optical axis;
    tuning support means connected to said optical source means for supporting the optical source means on or near said collimating lens means central optical axis and for permitting adjustment of the position of the optical source means with respect to the central optical axis; and
    grating means, optically coupled to and fixed in a non-perpendicular position relative to said collimating lens means, for receiving said collimated light at an angle substantially non-perpendicular to the optical axis which results in resonance at a predetermined tuned wavelength determined by the position adjustment of said optical source,
    wherein said support means comprises means for permitting adjustment of the source means position in the lateral extent with respect to said central optical axis and in the longitudinal extent with respect to said lens means, said lateral extent adjustment providing a coarse tuning of said wavelength, said longitudinal extent adjustment providing fine tuning of said wavelength.

11. A laser as in claim 10 wherein said lens means has a dimension along said central optical axis which is slightly short of an odd multiple of an quarter pitch of said predetermined tuned wavelength.

12. A laser as in claim 10 wherein said collimating lens means comprises a spherical lens.

13. A laser as in claim 10 further including prism means for coupling collimated light from said collimating lens means to said grating means.

14. A laser as in claim 13 wherein said prism means comprises an integral part of said collimating lens means.

15. A laser as in claim 10 wherein said grating means is fixed with respect to said source means.

16. A laser as in claim 10 wherein said grating means comprises means for diffracting said collimated light and for providing frequency selective feedback of light.

* * * * *